(12) United States Patent
Hashimoto et al.

(10) Patent No.: US 10,203,605 B2
(45) Date of Patent: Feb. 12, 2019

(54) DEVELOPMENT METHOD, DEVELOPMENT DEVICE, AND NON-TRANSITORY COMPUTER-READABLE STORAGE MEDIUM

(71) Applicant: Tokyo Electron Limited, Tokyo (JP)

(72) Inventors: Yusaku Hashimoto, Koshi (JP);
Takeshi Shimoaoki, Koshi (JP);
Masahiro Fukuda, Koshi (JP);
Kouichirou Tanaka, Koshi (JP)

(73) Assignee: Tokyo Electron Limited, Minato-Ku (JP)

(*) Notice: Subject to any disclaimer, the term of this patent is extended or adjusted under 35 U.S.C. 154(b) by 0 days.

(21) Appl. No.: 15/444,671

(22) Filed: Feb. 28, 2017

(65) Prior Publication Data

US 2017/0285481 A1    Oct. 5, 2017

(30) Foreign Application Priority Data

Apr. 1, 2016   (JP) .................................. 2016-074364

(51) Int. Cl.
| | | |
|---|---|---|
| *G03F 7/32* | (2006.01) | |
| *G03F 7/26* | (2006.01) | |
| *B05D 1/00* | (2006.01) | |
| *G03F 7/30* | (2006.01) | |
| *G03F 7/40* | (2006.01) | |

(Continued)

(52) U.S. Cl.
CPC ............... *G03F 7/26* (2013.01); *B05D 1/002* (2013.01); *B05D 1/005* (2013.01); *G03F 7/3021* (2013.01); *G03F 7/3028* (2013.01); *G03F 7/3092* (2013.01); *G03F 7/32* (2013.01); *G03F 7/40* (2013.01); *H01L 21/0274* (2013.01); *H01L 21/6715* (2013.01)

(58) Field of Classification Search
CPC .......... G03F 7/32; G03F 7/3021; G03F 7/063; H01L 21/67051; H01L 21/6715; H01L 21/6708; B05D 1/002; B05D 1/005
USPC ............. 430/105, 434, 97; 396/564; 355/27; 118/320
See application file for complete search history.

(56) References Cited

U.S. PATENT DOCUMENTS

| | | | |
|---|---|---|---|
| 8,956,694 B2 | 2/2015 | Takeguchi et al. | |
| 2006/0040051 A1* | 2/2006 | Yamamoto | ............ G03F 7/3028 427/240 |
| 2011/0096304 A1* | 4/2011 | Takeguchi | ............ G03F 7/3021 355/27 |

FOREIGN PATENT DOCUMENTS

| | | | |
|---|---|---|---|
| JP | 2003272988 A | * | 9/2003 |
| JP | 2011-091274 A | | 5/2011 |

OTHER PUBLICATIONS

Machine translation of JP 2003-272988 (no date).*

* cited by examiner

*Primary Examiner* — Amanda C. Walke
(74) *Attorney, Agent, or Firm* — Burr & Brown, PLLC

(57) ABSTRACT

A development method includes: a development step of supplying a developing solution to a surface of a substrate for manufacturing a semiconductor device after undergoing formation of a resist film and exposure, to perform development; a first rotation step of, after the development step, increasing revolution speed of the substrate to rotate the substrate in a first rotational direction around a central axis so as to spin off and remove part of the developing solution from the substrate; and a second rotation step of, after the first rotation step, rotating the substrate in a second rotational direction reverse to the first rotational direction so as (Continued)

to spin off and remove the developing solution remaining on the substrate from the substrate.

9 Claims, 17 Drawing Sheets

(51) Int. Cl.
*H01L 21/027* (2006.01)
*H01L 21/67* (2006.01)

→ · · · ROTATIONAL DIRECTION OF WAFER

→ · · · FLOW OF DEVELOPING SOLUTION

DEVELOPMENT METHOD, DEVELOPMENT DEVICE, AND NON-TRANSITORY COMPUTER-READABLE STORAGE MEDIUM

CROSS-REFERENCE TO RELATED APPLICATIONS

This application is based upon and claims the benefit of priority from Japanese Patent Application No. 2016-74364, filed on Apr. 1, 2016; the entire contents of which are incorporated herein by reference.

BACKGROUND OF THE INVENTION

Field of the Invention

The present invention relates to a technology for developing a substrate for manufacturing semiconductor devices.

Description of the Related Art

In photolithography in a manufacturing process of a semiconductor device, a resist film is formed on a surface of a semiconductor wafer (hereinafter referred to as a wafer) used as a substrate, and thereafter the exposure of the resist film is performed. The exposure is carried out by moving a mask, having openings extending along the circuit pattern, relative to the surface of the wafer while intermittently irradiating the wafer with light via the mask. After the exposure, a resist pattern is formed by supplying a developing solution to the wafer. Japanese patent application publication No. 2011-91274 discloses a method for supplying the developing solution. Incidentally, for promoting the miniaturization of the CD (Critical Dimension) which indicates a dimension of the resist pattern, it is being required to increase the uniformity of the CD in each part on the surface of the wafer. For this, it is being requested to increase not only the uniformity of the CD among regions (shot regions) on the wafer surface each of which has undergone the aforementioned light irradiation (shot) but also the uniformity of the CD of the pattern in each shot region.

The present inventors are considering that variations among parts in the shot region in the time of remaining in contact with the developing solution when the developing solution is spun off and removed from the wafer is a factor decreasing the uniformity of the CD among parts in the shot region. The aforementioned Japanese patent application publication No. 2011-91274 describes switching of the rotational direction of the wafer between one direction and the other direction in a process of supplying the developing solution to the surface to form a puddle of developing solution on the surface of the wafer. However, the technology disclosed in Japanese patent application publication No. 2011-91274 does not pay attention to the above problem arising in the spin drying of the developing solution and is incapable of resolving the problem.

SUMMARY OF THE INVENTION

The present invention has been contrived in light of the above-mentioned circumstances, and an object thereof is to perform the development process in such a manner as to achieve high uniformity of the dimension of the resist pattern on the surface of a substrate for manufacturing a semiconductor device after undergoing the formation of the resist film and the exposure.

One aspect of the present invention is directed to a development method comprising: a development step of supplying a developing solution to a surface of a substrate for manufacturing a semiconductor device after undergoing formation of a resist film and exposure, to perform development; a first rotation step of, after the development step, increasing revolution speed of the substrate to rotate the substrate in a first rotational direction around a central axis so as to spin off and remove part of the developing solution from the substrate; and a second rotation step of, after the first rotation step, rotating the substrate in a second rotational direction reverse to the first rotational direction so as to spin off and remove the developing solution remaining on the substrate from the substrate.

Another aspect of the present invention is directed to a development device comprising: a substrate holding unit that horizontally holds a substrate for manufacturing a semiconductor device after undergoing formation of a resist film and exposure; a rotating mechanism that rotates the substrate holding unit and thereby rotates the substrate around a central axis; a developing solution supply unit that supplies a developing solution to a surface of the substrate; and a control unit that outputs control signals to execute a step of supplying the developing solution to the substrate to perform development, then execute a step of increasing revolution speed to rotate the substrate in a first rotational direction so as to spin off and remove part of the developing solution from the substrate, and then execute a step of rotating the substrate in a second rotational direction reverse to the first rotational direction so as to spin off and remove the developing solution remaining on the substrate from the substrate.

Another aspect of the present invention is directed to a non-transitory computer-readable storage medium storing a computer program to be used by a development device that performs development on a substrate for manufacturing a semiconductor device after undergoing formation of a resist film and exposure, wherein the computer program includes steps for executing the development method.

According to the present invention, a developing solution on a substrate for manufacturing a semiconductor device that has undergone the development is spun off by rotating the substrate in a first rotational direction around the central axis of the substrate and thereafter the remaining developing solution is spun off by rotating the substrate in a second rotational direction reverse to the first rotational direction. Accordingly, variations in the time of remaining in contact with the developing solution and being developed in the spin drying among parts on the surface of the substrate can be restrained. Consequently, the uniformity of the dimension of the resist pattern on the surface of the substrate can be increased.

DETAILED DESCRIPTION OF THE INVENTION

Figure 1:
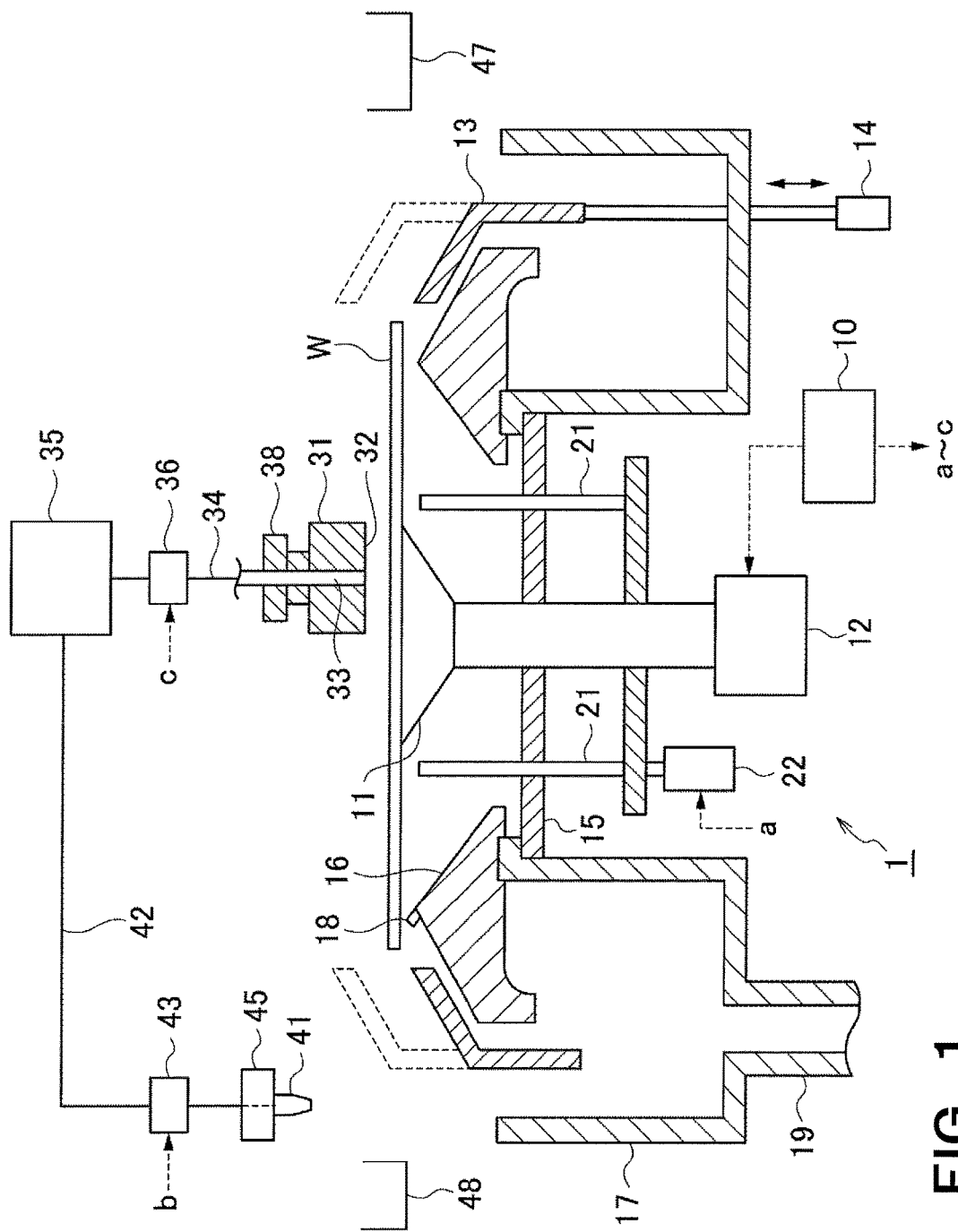
FIG. 1 is a vertical sectional side view of a development device according to an embodiment of the present invention.
Figure 2:
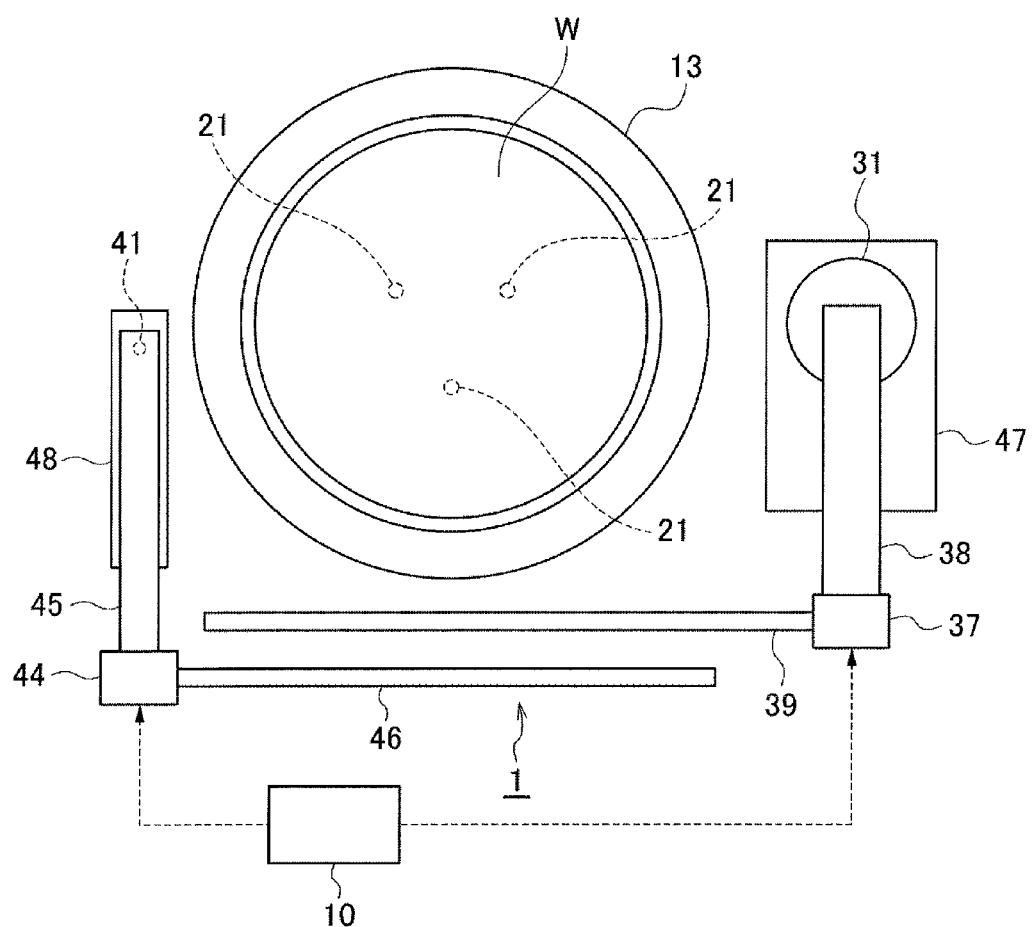
FIG. 2 is a plan view of the development device.

A development device 1 according to an embodiment of the present invention will be described below referring to a vertical sectional side view of FIG. 1 and a horizontal sectional plan view of FIG. 2. The development device 1 performs a development process on a wafer W which is a substrate for manufacturing a semiconductor device that has undergone formation of a resist film of a negative photoresist on its front surface and exposure of the resist film. The reference character 11 in the drawings represents a spin chuck serving as a substrate holding unit. The spin chuck 11 vacuum-sucks a central part of a back surface of the wafer W to horizontally holds a wafer W. The reference character 12 represents a rotating mechanism for rotating the spin chuck 11 and thereby rotating the wafer W held by the spin chuck 11 around the central axis of the wafer W. The rotating mechanism 12 is capable of switching the direction of rotation. Clockwise rotation and counterclockwise rotation of the wafer W, as viewed from the front side of the wafer W, will sometimes be referred to respectively as normal rotation and reverse rotation in the following description.

The reference character 13 in the drawings represents a cup formed in a vertical cylindrical shape for receiving liquid. An upper part of the cup 13 is inclined inward. The reference character 14 represents an elevation mechanism. The elevation mechanism 14 elevates and lowers the cup 13 between a handover position for times when a wafer W is handed over to the spin chuck 11 (the position indicated by solid lines in FIG. 1) and a processing position for times when the development process is carried out (the position indicated by dotted lines in FIG. 1). A round plate 15 is arranged under the wafer W held by the spin chuck 11. A guide member 16 having a mountain-like vertical sectional shape is arranged like a ring outside the round plate 15. The guide member 16 is configured to guide the developing solution spilling from the wafer W, to a liquid receiving part 17 arranged outside the round plate 15. The reference character 18 represents a back surface cleaning nozzle 18 provided with the guide member 16. The back surface cleaning nozzle 18 discharges a cleaning liquid towards a circumferential part of the back surface of the rotating wafer W to perform the cleaning.

The aforementioned liquid receiving part 17 is configured as a recessed part formed in a ring-like shape to surround the spin chuck 11. The liquid receiving part 17 is connected to an unshown liquid waste part via a drain pipe 19. The reference character 21 in the drawings represents an elevation pin for handing over a wafer W between the spin chuck 11 and an unshown substrate transfer mechanism. The reference character 22 in the drawings represents an elevation mechanism for elevating and lowering the elevation pin 21.

The reference character 31 in the drawings represents a developing solution nozzle for supplying the developing solution to the wafer W. The developing solution nozzle 31 is formed in a vertical circular cylindrical shape. The lower surface 32 of the developing solution nozzle 31 is formed as a horizontal surface and a supply hole 33 for supplying the developing solution is open downward in the vertical direction at the center of the lower surface 32. The supply hole 33 is connected via a developing solution supply tube 34 to a supply source 35 storing the developing solution made of an organic solvent such as butyl acetate. The reference character 36 in the drawings represents a developing solution supply mechanism arranged in the developing solution supply tube 34. The supply mechanism 36 is formed by a valve and a mass flow controller and controls the flow rate of the developing solution supplied from the supply source 35 to the developing solution nozzle 31. The reference character 37 in the drawings represents a moving mechanism for horizontally moving, elevating and lowering the developing solution nozzle 31 via an arm 38 supporting the developing solution nozzle 31. The reference character 39 in the drawings represents a guide for the horizontal movement of the moving mechanism 37.

Figure 3:
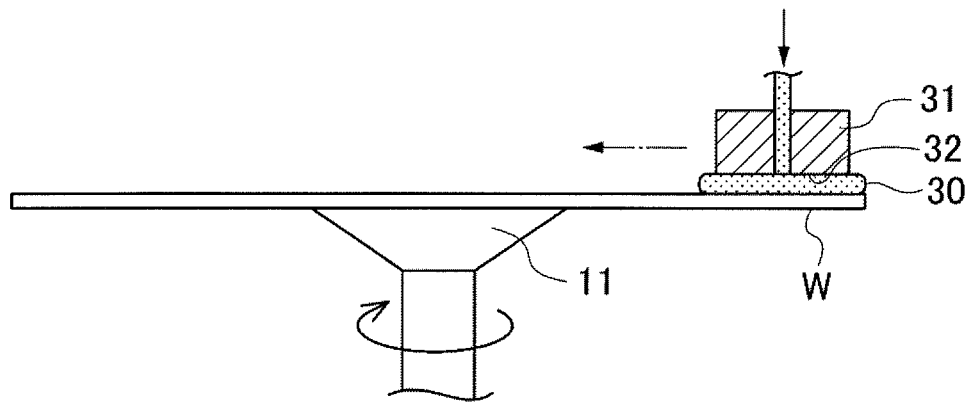
FIG. 3 is an explanatory drawing showing the operation of a developing solution nozzle of the development device.
Figure 4:
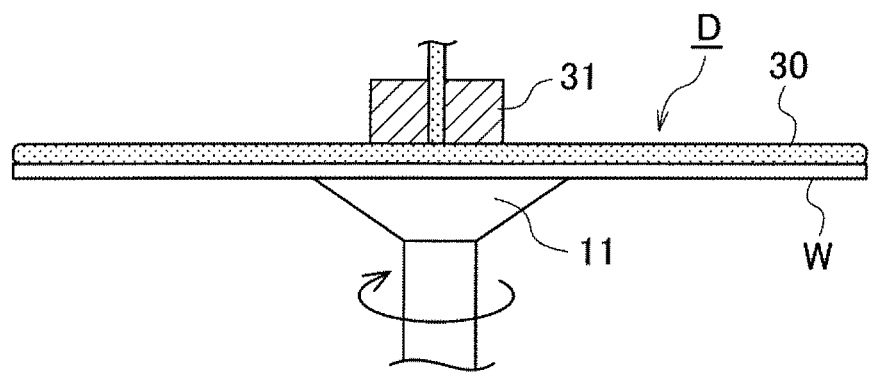
FIG. 4 is an explanatory drawing showing the operation of the developing solution nozzle.

As shown in FIG. 3, the aforementioned developing solution nozzle 31 constituting a developing solution supply unit moves along a radius of the wafer W from the circumferential part towards the central part of the wafer W, in a state where the lower surface 32 is positioned in the vicinity of and facing the front surface of the wafer W rotated by the rotating mechanism 12 and the developing solution 30 is being discharged from the supply hole 33. By this operation, a liquid film D of the developing solution 30 is formed on the front surface of the wafer W as shown in FIG. 4. Between the lower surface 32 of the developing solution nozzle 31 moving as above and the front surface of the rotating wafer W, the supplied developing solution 30 is stirred due to the surface tension of the lower surface 32 and that of the front surface of the wafer W and the concentration of the developing solution 30 is uniformized, which contributes to uniformization of the CD of the pattern on the surface of the wafer W.

Returning to FIGS. 1 and 2, explanation of components of the development device 1 will be continued below. The reference character 41 in the drawings represents a developing solution nozzle that discharges the developing solution downward in the vertical direction. The developing solution nozzle 41 supplies the developing solution to the front surface of the wafer W before the liquid film D of the developing solution is formed by the developing solution nozzle 31 as explained referring to FIGS. 3 and 4. The developing solution nozzle 41 supplies the developing solution for the purpose of increasing wettability of the developing solution supplied from the developing solution nozzle 31. The developing solution nozzle 41 is connected to the aforementioned supply source 35 of the developing solution via a developing solution supply tube 42. A supply mechanism 43 configured similarly to the supply mechanism 36 is arranged in the developing solution supply tube 42 and adjusts the flow rate of the developing solution supplied to the developing solution nozzle 41. The reference character 44 in the drawings represents a moving mechanism for horizontally moving, elevating and lowering the developing solution nozzle 41 via an arm 45 supporting the developing solution nozzle 41. The reference character 46 in the drawings represents a guide for the horizontal movement of the moving mechanism 44. The reference character 47 in the drawings represents a standby part for the developing solution nozzle 31, and the reference character 48 in the drawings represents a standby part for the developing solution nozzle 41. The standby parts 47, 48 each are arranged outside the cup 13 in the plan view and keep the developing solution nozzles 31, 41 on standby when no processing is performed on the wafer W.

The development device 1 is equipped with a control unit 10 configured by a computer. The control unit 10 has an unshown program storage unit. The program storage unit stores a program in which commands (steps) have been programmed so as to carry out the development process which will be explained later. According to the program, the control unit 10 outputs control signals to components of the development device 1 so as to control operations, such as the movement of the developing solution nozzles 31 and 41 by the moving mechanisms 37 and 44, the revolution speed and direction of the rotation of the wafer W by the rotating mechanism 12, the supply of the developing solution to the wafer W by the supply mechanisms 36 and 43 and the elevation and lowering of the elevation pin 21 by the elevation mechanism 22, in such a manner that the development process can be performed on the wafer W as will be explained later. Incidentally, the development process also includes spinning-off of the developing solution after the development. The program, in a state of a program stored in a non-transitory computer-readable storage medium such as a hard disk, a compact disc, a magneto-optic disk or a memory card, is stored in the program storage unit.

Figure 5:
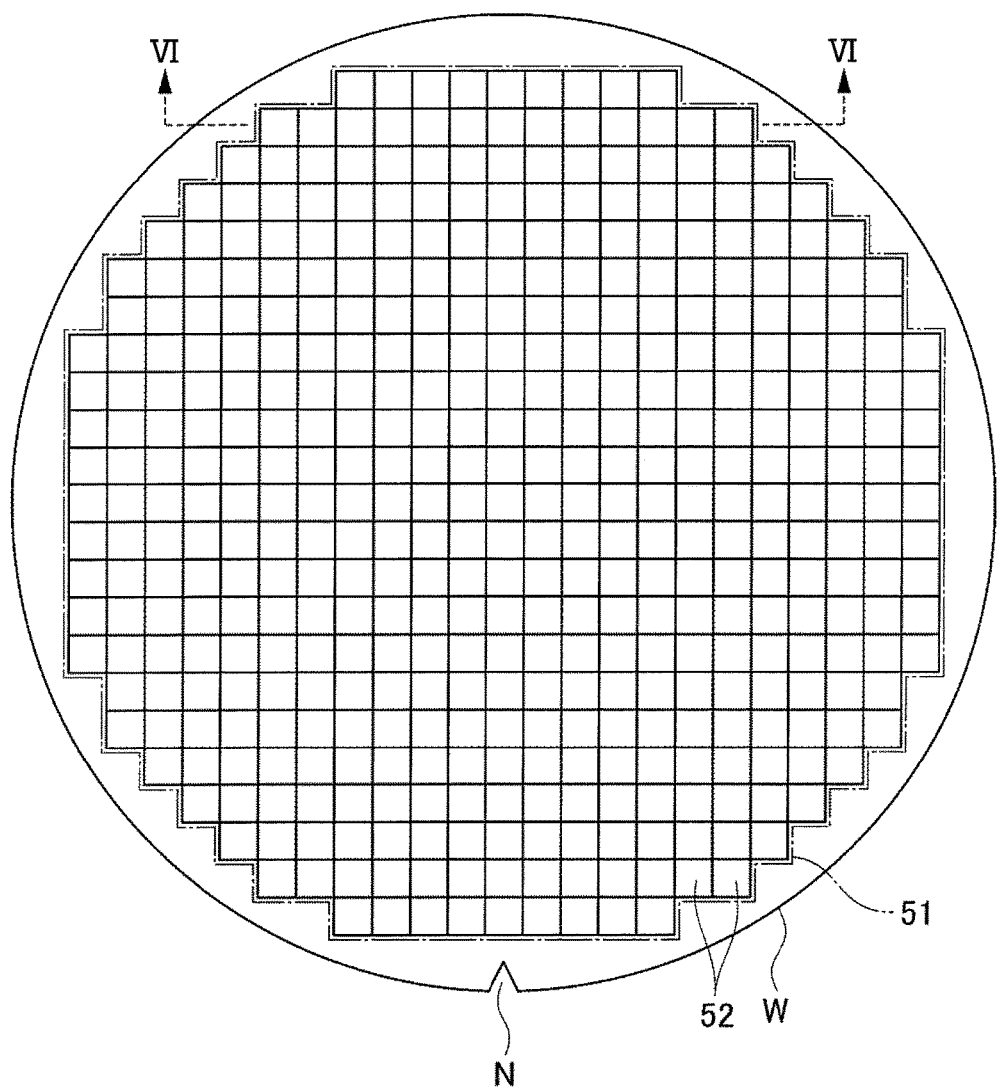
FIG. 5 is a plan view of a wafer processed by the development device.

In the development device 1, after forming the liquid film D of the developing solution 30 as explained referring to FIGS. 3 and 4, the wafer W is rotated in the reverse direction to spin off the developing solution 30, and subsequently, the wafer W is rotated in the normal direction and the developing solution 30 remaining on the wafer W is spun off. Before explaining the reason for switching the rotational direction like this, the wafer W processed by the development device 1 will be explained in detail first by referring to a plan view of FIG. 5. The reference character N in FIG. 5 represents a notch that indicates the orientation of the wafer W. If we define a longitudinal direction on the front surface of the wafer W as the direction of formation of the notch N, the light irradiation (shot) has been performed at matrix-like positions arranged in the longitudinal direction and the transverse direction in a semiconductor device formation region 51. In other words, a lot of shot regions 52 are arranged in the longitudinal and transverse directions. A semiconductor device is made from each shot region 52.

Figure 6:
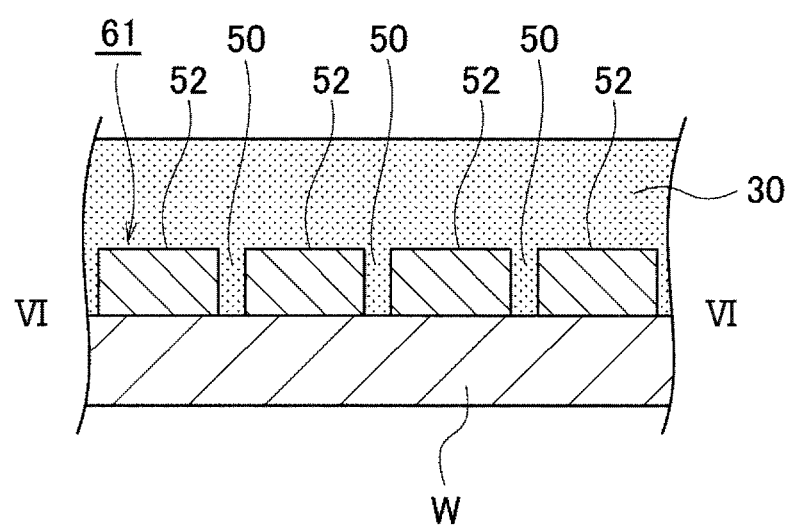
FIG. 6 is a vertical sectional side view taken along line VI-VI in FIG. 5.

By the development process, a resist pattern is formed in each shot region 52, and the resist between shot regions 52 is dissolved in such a manner that grooves 50 are formed to surround each shot region 52. Thus, the front surface of the wafer W after undergoing the development process has straight grooves 50 each extending in the longitudinal or transverse direction from one end to the other end of the wafer W. FIG. 6 shows the cross section along VI-VI line shown in FIG. 5 when the grooves 50 have been formed. The reference character 61 in FIG. 6 represents the resist film in which the shot regions 52 have been formed. Due to the grooves 50 formed as above, in shot regions 52 included in a cross-shaped area 53 in FIG. 7 extending along diameters of the wafer W, the mode of flow of the developing solution 30 during the spin drying of the solution becomes different from the mode in shot regions 52 outside the cross-shaped area 53, and thus the uniformity of the CD tends to decrease when the spin drying of the developing solution is performed by only the normal rotation of the wafer W, for example.

Figure 7:
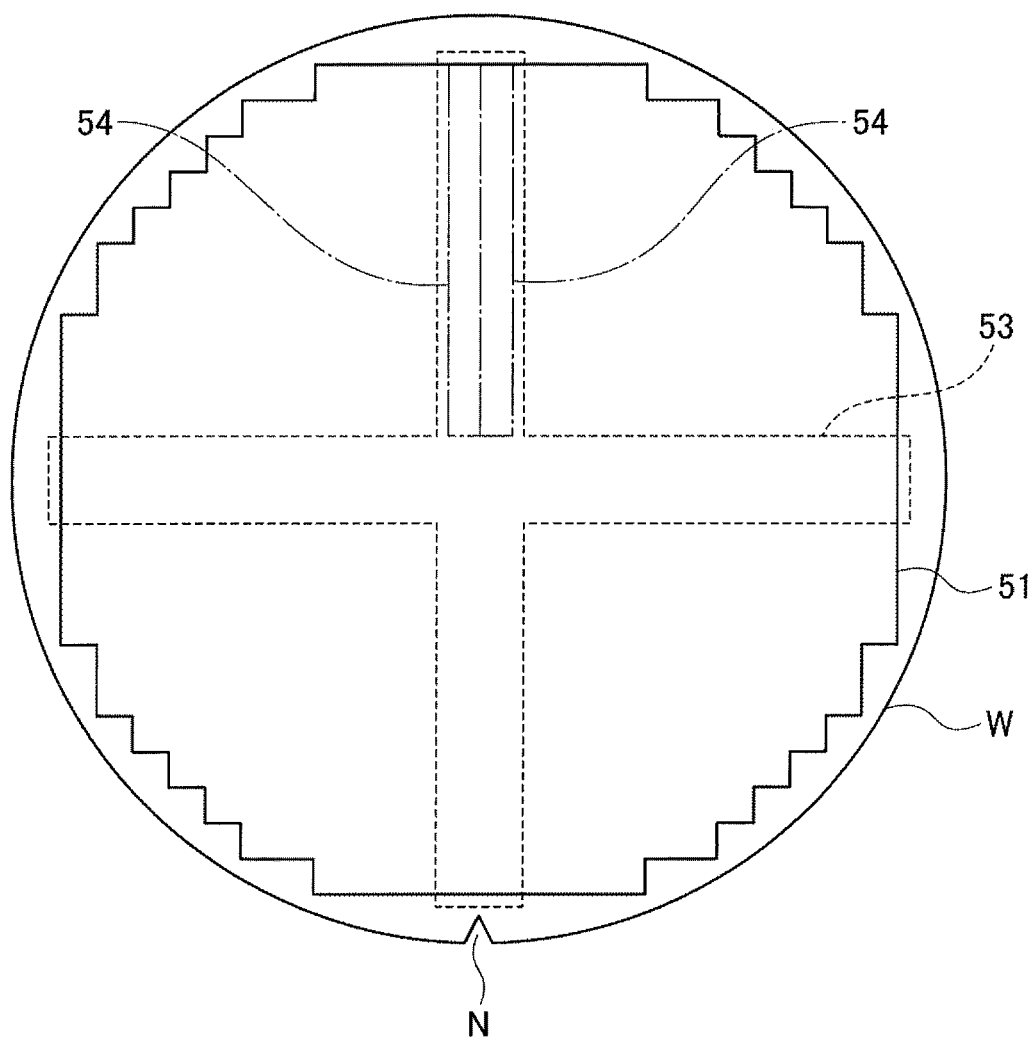
FIG. 7 is a schematic plan view of the wafer.
Figure 8A:
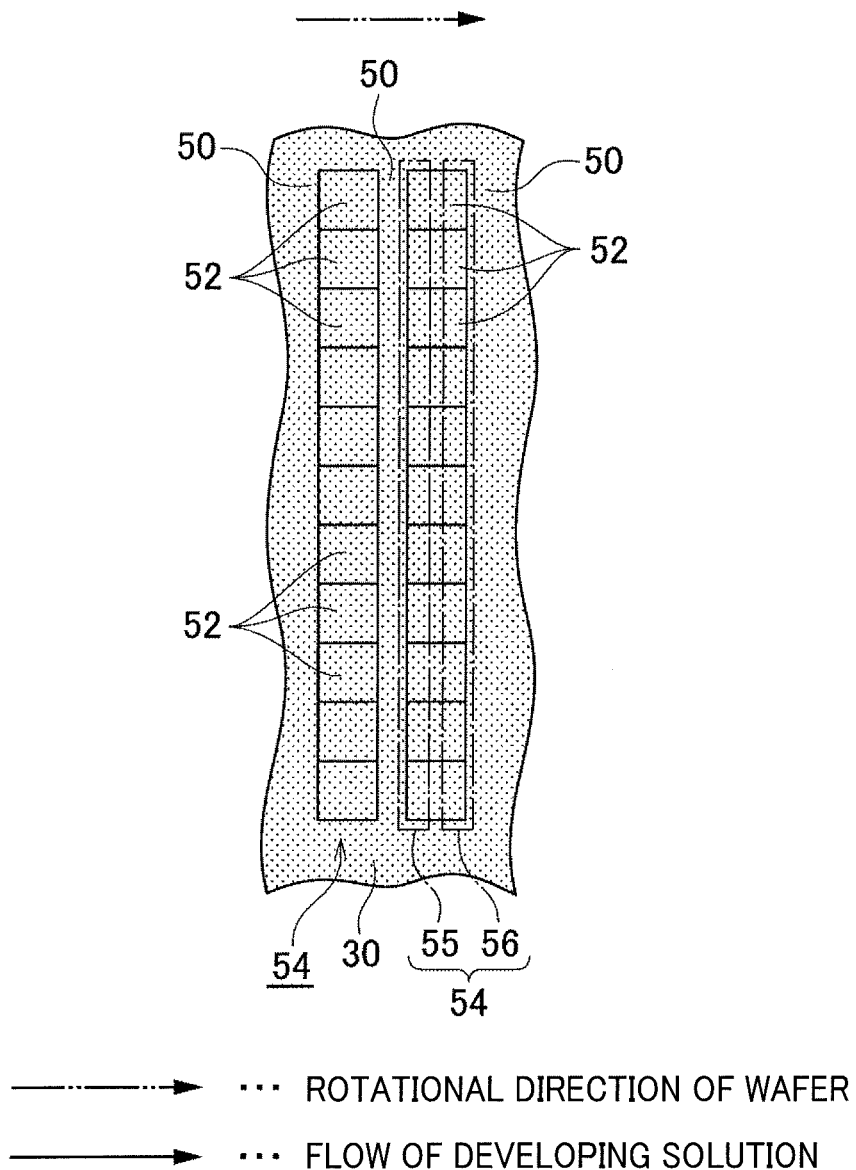
FIGS. 8A to 8C are schematic diagrams showing the flow of developing solution in a case where the processing is performed by a method different from the present invention.
Figure 8B:
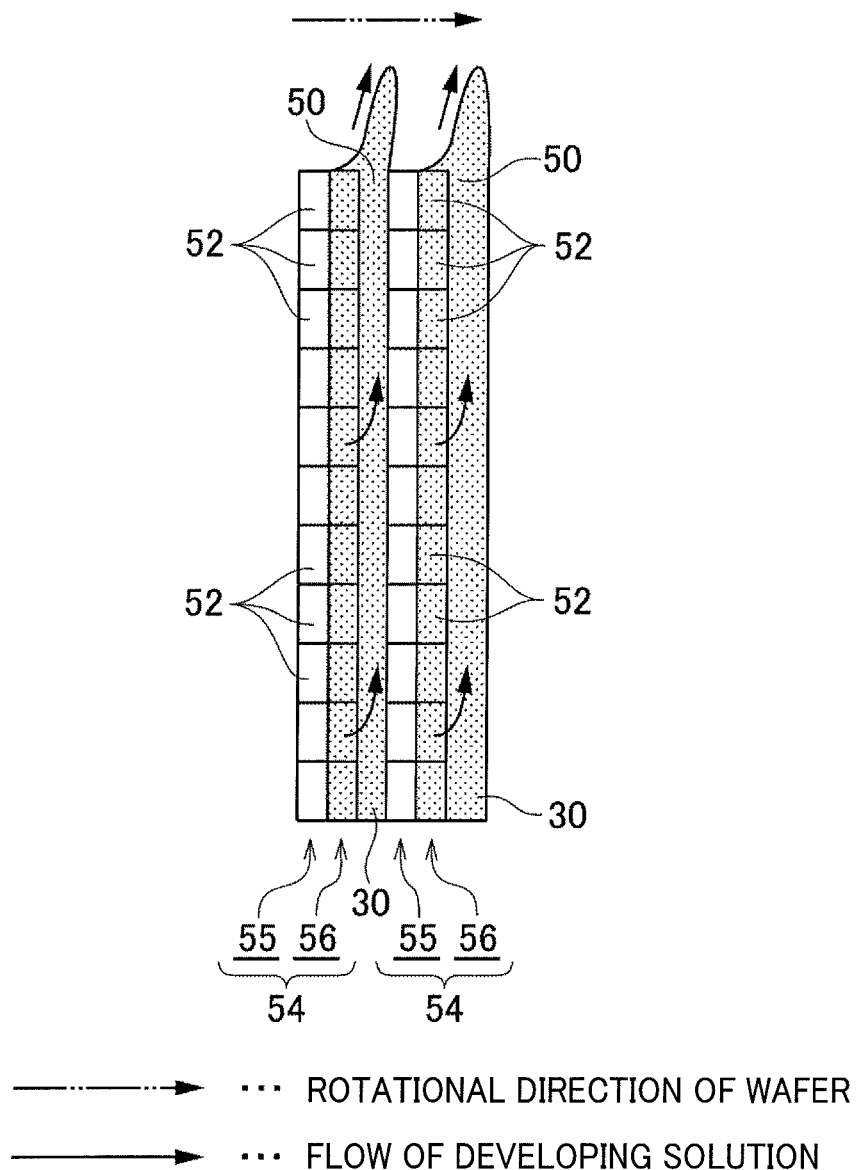
Figure 8C:
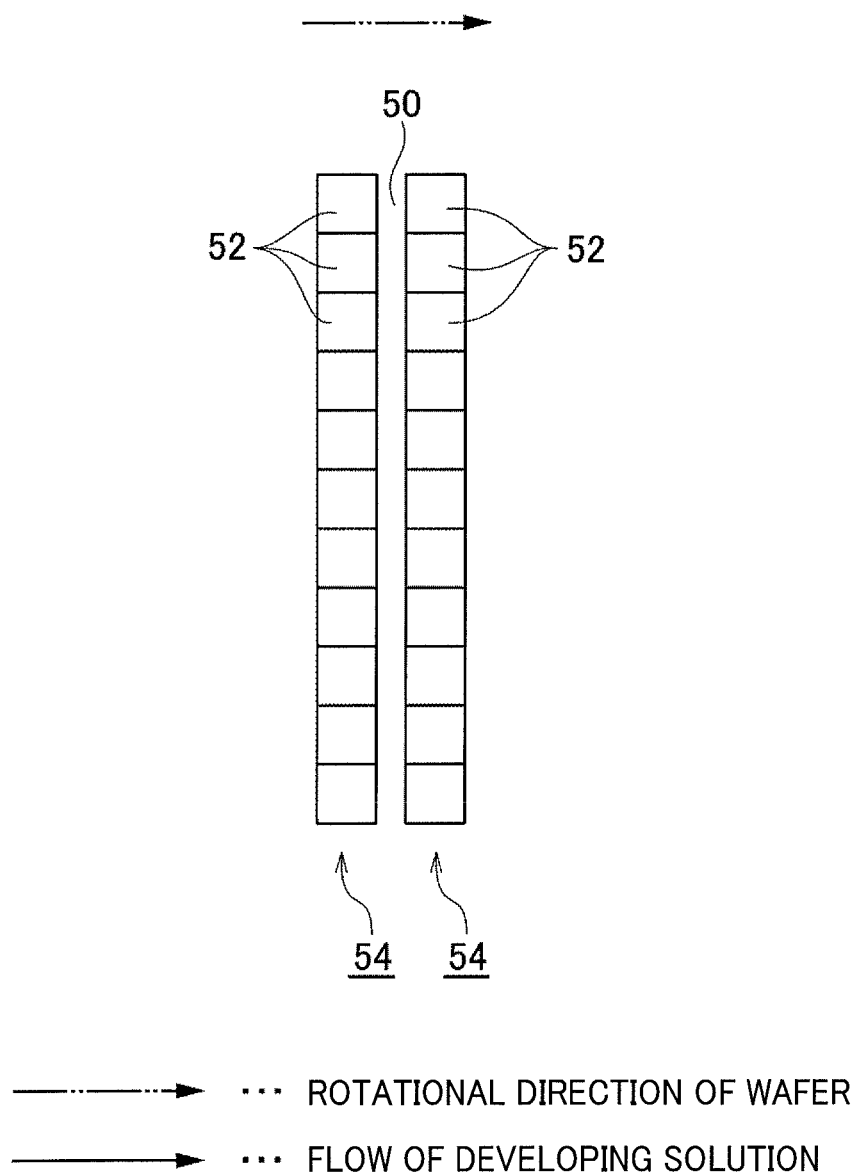

The flow of the developing solution 30 on the surface of two lines 54 of shot regions 52 in the longitudinal direction included in the cross-shaped area 53 when the developing solution is removed by performing only the normal rotation as above will be explained concretely below by referring to a schematic diagram of FIGS. 8A-8C. The two lines 54 are situated on a radius of the wafer W and adjoining each other in the transverse direction as shown in FIG. 7. For simplicity of explanation, the groove 50 formed in the longitudinal direction between the two lines 54 is emphasized and grooves 50 formed in the transverse direction are omitted in FIGS. 8A to 8C. Further, each line 54 is equally divided into two along the line 54 and the obtained two imaginary subregions are shown as subregions 55 and 56. The subregion 55 is a region on the upstream side in the rotational direction in the case of normal rotation, while the subregion 56 is a region on the downstream side in the rotational direction in the case of normal rotation. In FIGS. 8A to 8C, the rotational direction of the wafer W is indicated by arrows of two-dot chain lines and the flow direction of the developing solution 30 is indicated by arrows of solid lines.

When the normal rotation of the wafer W is started, the developing solution 30 that has covered the lines 54 moves on the surface of the wafer W towards the downstream side in the rotational direction due to the effect of the centrifugal force (FIG. 8A), and the developing solution 30 flowing from the line 54 on the upstream side in the rotational direction towards the line 54 on the downstream side in the rotational direction flows into the groove 50 between the lines 54. This groove 50 is formed straight towards the circumferential edge of the wafer W since the shot regions 52 are arranged like a matrix as mentioned above. This means that a discharge channel extending towards the outside of the wafer W has been formed as viewed from the developing solution 30, which has flowed into the groove 50, towards the circumferential edge of the wafer W. Accordingly, the developing solution 30 after flowing into the groove 50 is likely to flow along the groove 50 and be discharged from the circumferential edge of the wafer W, and is unlikely to cross the groove 50 and flow into the shot regions 52 on the downstream side in the rotational direction.

Due to the above-described flow of the developing solution 30, in the subregion 56 of each line 54 on the downstream side in the rotational direction, the development progresses due to the developing solution 30 remaining without being spun off. In contrast, in the subregion 55 of each line 54 on the upstream side in the rotational direction, the inflow of the developing solution 30 from the upstream side in the rotational direction is restrained by the groove 50 as explained above, and thus the drying progresses and the development stops (FIG. 8B). As the rotation of the wafer W is continued further, the developing solution 30 is gradually removed also from the subregion 56 on the downstream side in the rotational direction and the development ends (FIG. 8C). While illustration is omitted here, also in the lines of shot regions 52 in the transverse direction in the cross-shaped area 53, the removal of the developing solution 30 is considered to progress in the same way as in the lines 54 of shot regions 52 in the longitudinal direction shown in FIGS. 8A to 8C. To sum up, in the cross-shaped area 53, as compared to other areas on the surface of the wafer W, the developing solution 30 is unlikely to flow into the shot regions 52 on the downstream side in the rotational direction and likely to be discharged from the grooves 50.

As explained above, in the shot regions 52 in the cross-shaped area 53, the time when the developing solution 30 is totally removed and the development process ends varies in each shot region 52, and thus the time (development time) for which the development process progresses due to the contact with the developing solution 30 varies among parts in the shot region 52. This can be considered to be the cause of the aforementioned decrease in the uniformity of the CD in the shot region 52.

Figure 9:
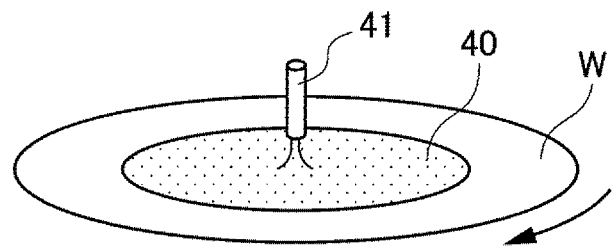
FIG. 9 is an explanatory drawing showing a processing step performed by the development device.
Figure 10:
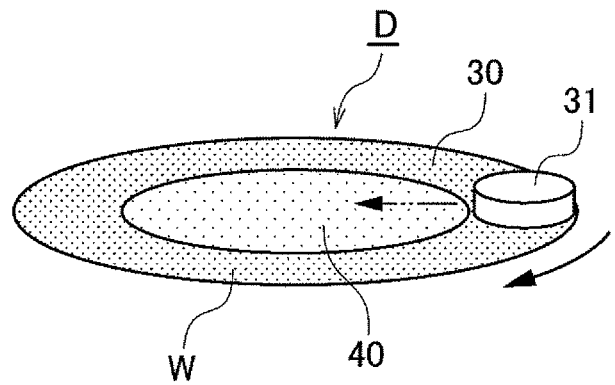
FIG. 10 is an explanatory drawing showing a processing step performed by the development device.
Figure 13:
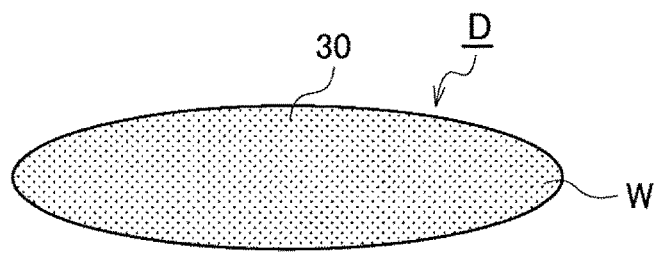
FIG. 13 is an explanatory drawing showing a processing step performed by the development device.
Figure 14:
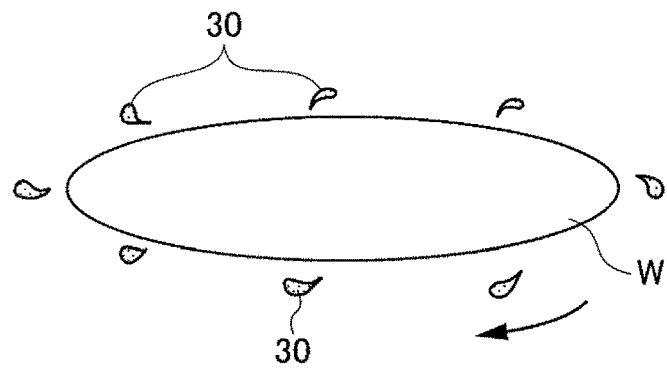
FIG. 14 is an explanatory drawing showing a processing step performed by the development device.
Figure 15:
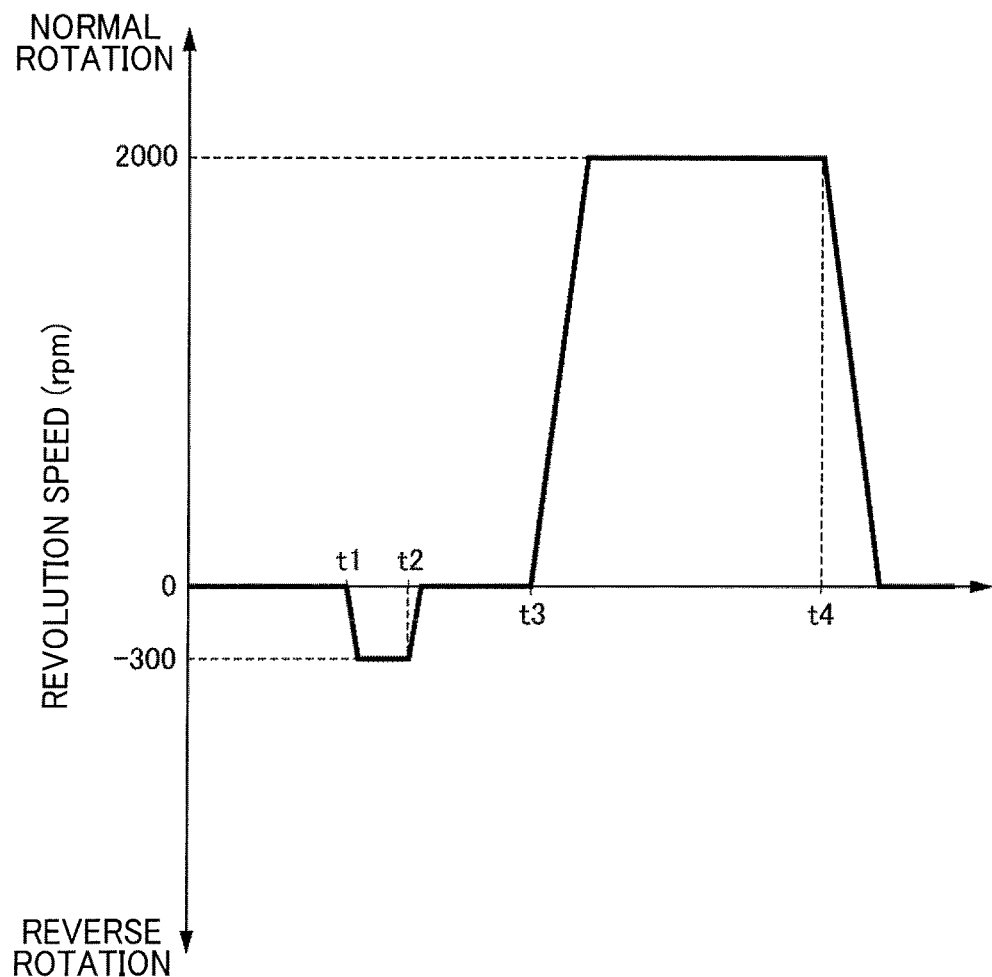
FIG. 15 is a timing chart showing transition of revolution speed of a wafer processed by the development device.

In order to restrain such variations in the development time, the development device 1 spins off the developing solution 30 by switching the rotational direction as mentioned above. In the following, processing performed in the development device 1 will be explained by referring to FIGS. 9 to 14 showing the status of the developing solution on the wafer W and FIG. 15 illustrating a timing chart showing transition of the revolution speed of the wafer W. In FIGS. 9 and 10, the developing solution discharged from the developing solution nozzle 41 is indicated with the reference character 40 to discriminate it from the developing solution 30 supplied from the developing solution nozzle 31. In FIGS. 9 to 14, the rotational direction of the wafer W is indicated by arrows of solid lines. The vertical axis of the chart of FIG. 15 represents the revolution speed of the wafer W. The revolution speed when the wafer W is rotating in the normal direction is represented by a positive value, while the revolution speed when the wafer W is rotating in the reverse direction is represented by a negative value.

First, the wafer W is set on the spin chuck 11 by an unshown transfer mechanism and the central part of the back surface of the wafer W is held by the spin chuck 11. Thereafter, a relatively small amount of developing solution 40 is supplied to the central part of the wafer W from the developing solution nozzle 41 which has moved from the standby part 48 to a position over the central part of the wafer W while the wafer W is rotated in the normal direction (FIG. 9). The developing solution 40 is expanded towards the circumferential part of the wafer W by the centrifugal force of the rotation of the wafer W and applied to the entire front surface of the wafer W, by which the prewetting for increasing the wettability of the developing solution 30 is carried out.

Thereafter, the developing solution nozzle 41 returns to the standby part 48 and the developing solution nozzle 31 moves from the standby part 47 to a position over the circumferential part of the wafer W to place the lower surface 32 in the vicinity of the front surface of the wafer W. Thereafter, onto the wafer W rotating in the normal direction at a revolution speed of 60 rpm, for example, the developing solution nozzle 31 discharges the developing solution 30 while moving towards a position over the central part of the wafer W (FIG. 10). In short, the liquid film D of the developing solution 30 is formed on the front surface of the wafer W as explained referring to FIGS. 3 and 4.

Figure 11:
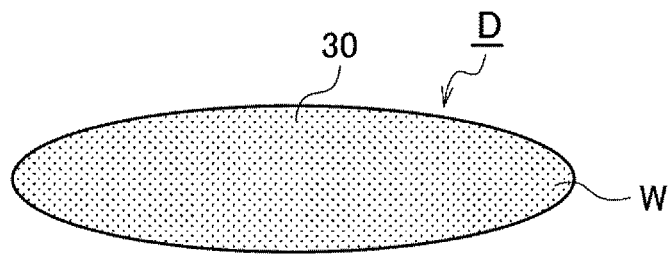
FIG. 11 is an explanatory drawing showing a processing step performed by the development device.

When the developing solution nozzle 31 has reached the central part of the wafer W and the liquid film D has been formed on the entire front surface of the wafer W, the supply of the developing solution 30 is stopped and the developing solution nozzle 31 returns to the standby part 47. Meanwhile, the wafer W rotating in the normal direction is stopped into a stationary state, the resist film on the front surface of the wafer W dissolves, and the resist pattern is developed in each shot region 52 (FIG. 11: development step). Around each shot region 52, the aforementioned grooves 50 demarcating the shot region 52 from adjoining shot regions 52 are formed.

Figure 12:
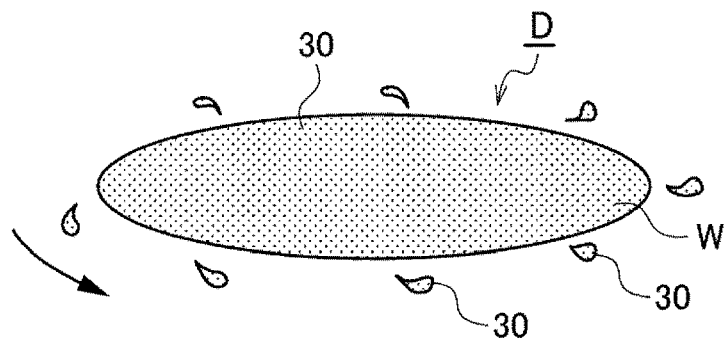
FIG. 12 is an explanatory drawing showing a processing step performed by the development device.

Thereafter, the wafer W starts the reverse rotation (rotation in the first rotational direction) (time t1 in the chart) and the revolution speed rises towards 300 rpm, for example, while part of the developing solution 30 forming the liquid film D is removed due to the centrifugal force of the rotation (FIG. 12: first rotation step). When one second has passed since the time t1, for example, the revolution speed of the wafer W starts dropping towards 0 rpm (time t2). Namely, the rotating wafer W is stopped into a stationary state (FIG. 13). When 1.2 seconds have passed since the time t2, for example, the wafer W starts the normal rotation (rotation in a second rotational direction) (time t3) and the revolution speed rises towards 2000 rpm, for example. Due to the centrifugal force of the rotation, the developing solution 30 remaining on the front surface of the wafer W is spun off (FIG. 14: second rotation step).

Along with the spin drying of the developing solution 30, the cleaning liquid is supplied from the back surface cleaning nozzle 18 and the circumferential part of the back surface of the wafer W is cleaned. When the cleaning of the back surface is finished and the removal of the developing solution 30 has progressed on the front surface of the wafer W to dry up the entire front surface, that is, when 15 seconds have passed since the time t3, for example, the revolution speed of the wafer W drops (time t4) and the rotation stops. Thereafter, the wafer W is unloaded from the development device 1 by the unshown transfer mechanism.

Figure 16A:
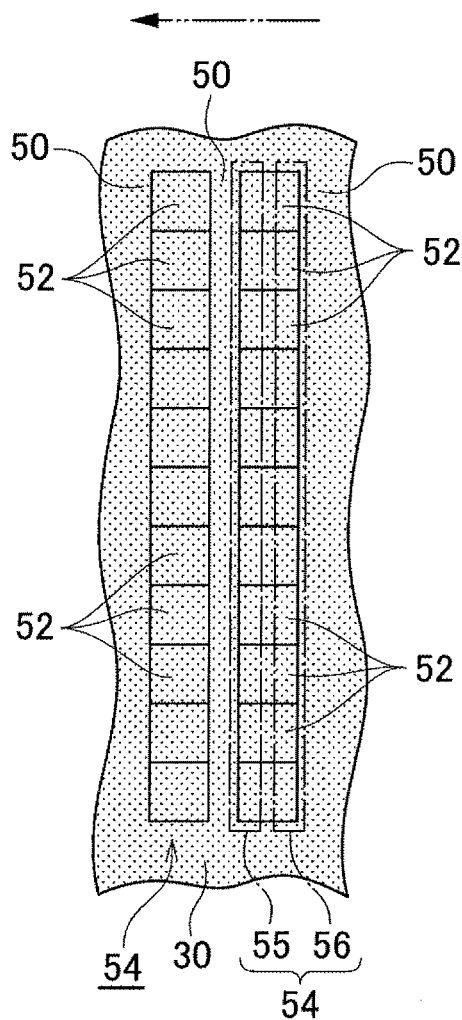
FIGS. 16A to 16D are schematic diagrams showing the flow of the developing solution in a case where the processing is performed by a method according to an embodiment of the present invention.
Figure 16B:
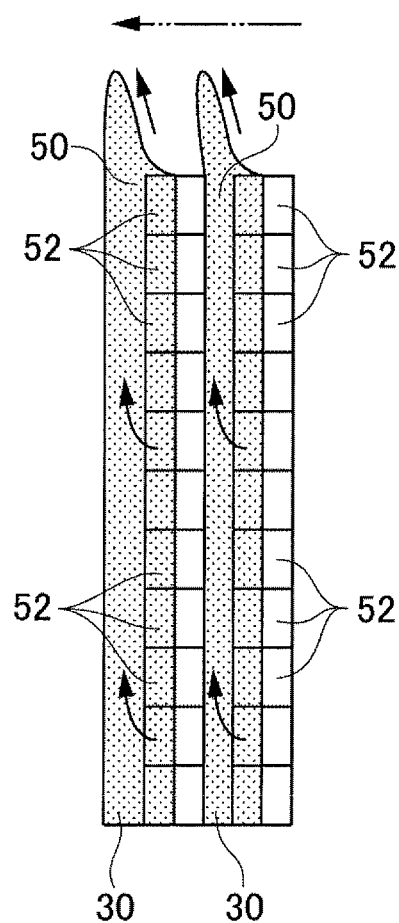

FIGS. 16A to 16D show, similarly to FIGS. 8A to 8C, the status of the developing solution 30 in the lines 54 of shot regions 52 when the spin drying of the developing solution 30 is performed like the aforementioned times t1 to t4. The flow of the developing solution 30 at the times t1 to t4 will be explained in more detail by referring to FIGS. 16A to 16D. In the reverse rotation in the time t1 to t2, the developing solution 30 that has covered the whole of the lines 54 moves towards the downstream side in the rotational direction due to the centrifugal force of the reverse rotation (FIG. 16A). As explained referring to FIGS. 8A to 8C, the developing solution flowing from the line 54 on the upstream side in the rotational direction towards the line 54 on the downstream side in the rotational direction flows into the groove 50 between the lines 54 and is likely to flow along the groove 50 and be discharged from the circumferential edge of the wafer W. Thus, in each line 54, the subregion on the upstream side in the rotational direction is likely to dry up, while the subregion on the downstream side in the rotational direction is unlikely to dry up. Since the wafer W is rotating reversely in this case, the removal and drying of the developing solution 30 progress and the development stops in the subregion 56, whereas the developing solution 30 remains and the development progresses in the subregion 55 (FIG. 16B).

Figure 16C:
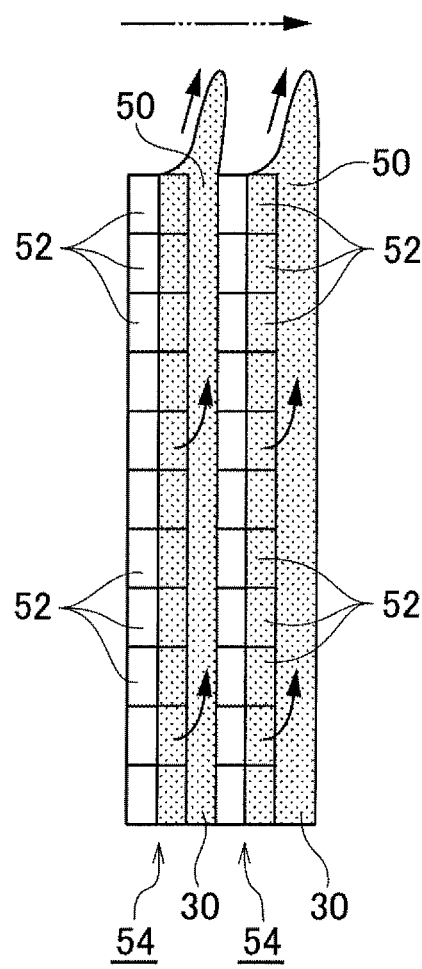
Figure 16D:
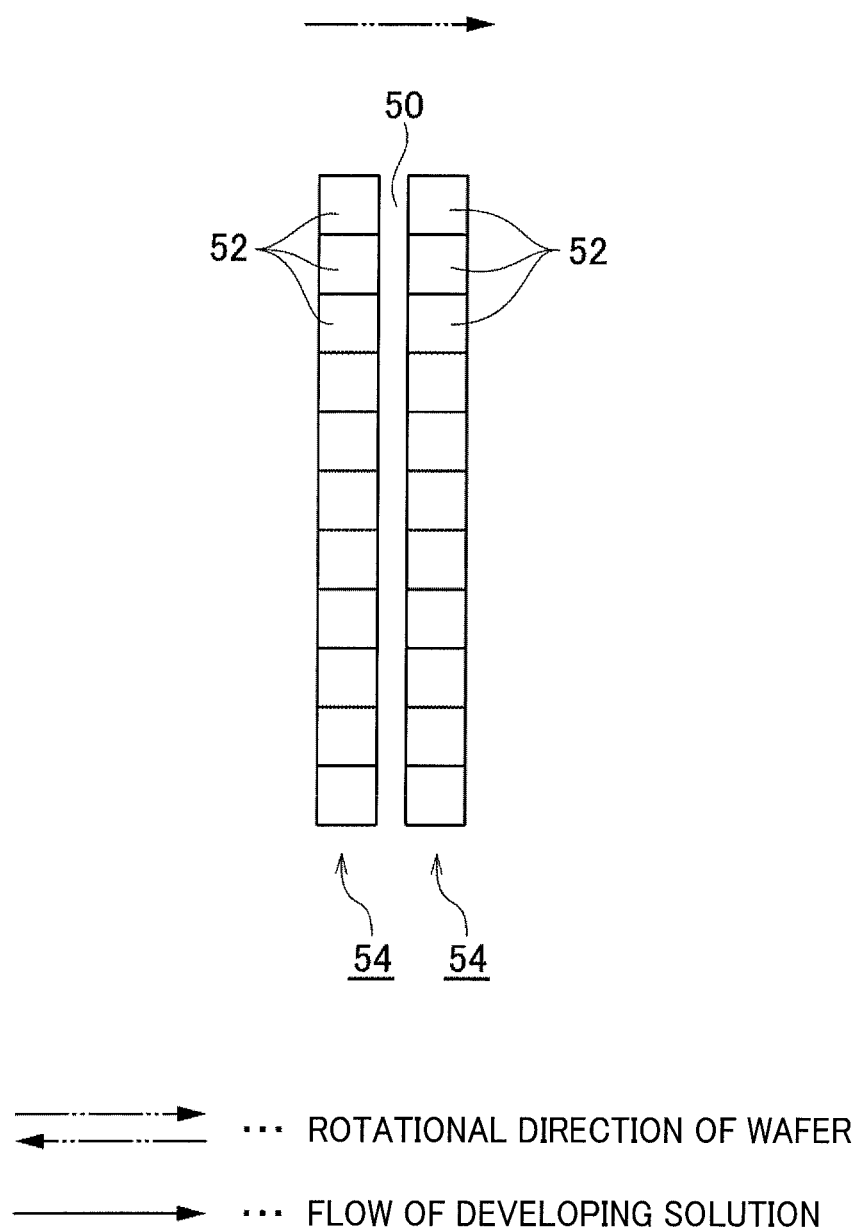

Thereafter, due to the normal rotation in the time t3 to t4, the developing solution 30 remaining on the front surface of the wafer W flows as explained referring to FIGS. 8A to 8C. Specifically, in the subregion 56 of each line 54 on the downstream side in the rotational direction, the development progresses due to the developing solution 30 still not spun off and remaining. In contrast, in the subregion 55 of each line 54 on the upstream side, the developing solution 30 is unlikely to be supplied, and thus the drying progresses and the development process stops (FIG. 16C). Thereafter, as the normal rotation of the wafer W is continued, the developing solution 30 is gradually removed also from the subregion 56 and the development ends (FIG. 16D).

As above, in the reverse rotation of the wafer W, the development in the subregion 56 is restrained, while the development in the subregion 55 progresses. In the normal rotation of the wafer W, the development in the subregion 55 is restrained, while the development in the subregion 56 progresses. Therefore, deviation in the development time between the subregions 55 and 56 can be reduced. While illustration and detailed explanation are omitted here, also in the lines of shot regions 52 in the transverse direction in the cross-shaped area 53, the developing solution 30 is removed properly and the deviation in the development time is reduced in the same way as in the lines 54 of shot regions 52 in the longitudinal direction shown in FIGS. 16A to 16D.

According to the development device 1, after forming the liquid film D of the developing solution 30 on the front surface of the wafer W and forming the resist pattern, the developing solution 30 is spun off by the reverse rotation of the wafer W, and the developing solution 30 is spun off further by the normal rotation of the wafer W. By performing the spin drying in such a manner, the development time of each part of the resist film in the shot region 52 can be uniformized and the decrease in the uniformity regarding the CD of the resist pattern, that is, the decrease in the uniformity regarding the dimensions of the pattern, can be restrained. Such an increase in the uniformity of the CD in the shot region 52 means an increase in the uniformity of the CD in each part on the entire surface of the wafer W.

Incidentally, to make a supplementary explanation of the aforementioned times t1 to t4 in the timing chart, the time t1 is the time when a control signal is outputted to start the reverse rotation, the time t2 is the time when a control signal is outputted to stop the reverse rotation, the time t3 is the time when a control signal is outputted to start the normal rotation, and the time t4 is the time when a control signal is outputted to stop the normal rotation. Thus, the time t1 to t2 will sometimes be referred to as "the time of performing the reverse rotation," and the time t3 to t4 will sometimes be referred to as "the time of performing the normal rotation."

If the time of performing the reverse rotation (the time t1 to t2) is too long, the drying progresses excessively in a larger area in the shot region 52. Specifically, in each of the aforementioned lines 54, the drying progresses further in an area larger than the subregion 56 in FIG. 16B, for example. As a result, it becomes impossible to uniformize the development time among parts in the shot region 52 at the end of the process.

In contrast, if the time of performing the reverse rotation is too short, it becomes impossible to sufficiently remove the developing solution 30 from a part in the shot region 52 by the reverse rotation. Specifically, in each of the aforementioned lines 54, the developing solution 30 is not removed sufficiently from the subregion 56 during the reverse rotation, for example. As a result, it becomes impossible to uniformize the development time in the shot region 52 at the end of the process. In consideration of these reasons and evaluation tests that showed excellent results when the time of performing the reverse rotation was one second as will be explained later, the time of performing the reverse rotation is preferably 1 to 2 seconds.

If the revolution speed of the reverse rotation is too high, the drying progresses excessively in a larger area in the shot region 52, similarly to the case where the time of performing the reverse rotation is too long. If the revolution speed is too low, it becomes impossible to sufficiently discharge the developing solution 30 from a part in the shot region 52, similarly to the case where the time of performing the reverse rotation is too short. In consideration of these reasons and results of evaluation tests which will be explained later, the revolution speed of the reverse rotation is preferably 150 to 1500 rpm, and more preferably, 200 to 600 rpm.

The reverse rotation is performed at a revolution speed at which the developing solution 30 is not removed from the entire shot region 52 as described above. However, the normal rotation is performed so that the developing solution 30 is totally removed from the entire shot region 52. Therefore, the revolution speed of the normal rotation (a second revolution speed) in the time t3 to t4 is preferably higher than the revolution speed of the reverse rotation (a first revolution speed) in the time t1 to t2 as described above. Although there is a time lag between the time point when the control signal is outputted and the time point when the revolution speed of the wafer W reaches the revolution speed specified by the control signal after a transition, the revolution speed of the normal/reverse rotation discussed here means not the revolution speed during the transition but the revolution speed specified by the control signal. Further, for a similar reason, the time of performing the reverse rotation is preferably shorter than the time of performing the normal rotation.

The time for stopping the wafer W in the time t2 to t3 is not limited to the above example but can be set properly. For example, it is possible to stop the wafer W only at the moment of switching the rotational direction. While the above explanation has been given assuming that the spin drying by the reverse rotation is performed and thereafter the spin drying by the normal rotation is performed, it is also possible to perform the spin drying by the normal rotation and thereafter perform the spin drying by the reverse rotation. Further, in the spin drying of the developing solution, the number of times of switching the rotational direction of the wafer W is not limited to once but can be multiple times. For example, it is possible to spin off the developing solution by rotating the wafer W in the order of reverse rotation, normal rotation and reverse rotation. Furthermore, while the above-described development device 1 supplies a developing solution for a negative photoresist, the development device 1 may also be configured to supply a developing solution for a positive photoresist.

The method for forming the liquid film D is not limited to the above example. For example, it is possible to provide the development device 1 with a developing solution nozzle moving in a horizontal direction and having a slit-like discharge hole opening in a horizontal direction orthogonal to the moving direction, and to form the liquid film D by having the developing solution nozzle discharge the developing solution while moving from above one end to above the other end of the wafer W.

Although the rotation of the wafer W is stopped to develop the pattern after supplying the developing solution 30 in the above process example, the wafer W may keep rotating at a low revolution speed like several rpm as long as the developing solution is retained on the front surface of the wafer W and the development is not inhibited. The process for spinning off the developing solution 30 as explained above can be carried out by raising the revolution speed of the wafer W from such a low-speed revolution state.

The substrates for manufacturing semiconductor devices, to which the present invention is applied, include not only wafers but also substrates for manufacturing liquid crystal displays (LCD substrates). Such an LCD substrate can be referred to as a substrate for manufacturing a semiconductor device as in this embodiment since semiconductor devices such as TFTs (Thin-film Transistors) are formed in the process of manufacturing liquid crystal displays. Also on the LCD substrate, the grooves 50 in the longitudinal and transverse directions are formed by the development similarly to the case of the wafer, and thus the variations in the development time in each part on the substrate surface in the spin drying of the developing solution can be restrained by employing the present invention.

It is also possible to properly combine some of the examples described above. For example, in the case of spinning off the developing solution 30 by performing the normal rotation and subsequently performing the reverse rotation, the process can be carried out by performing the normal rotation at the revolution speed explained as the revolution speed for the time t1 to t2 and for the time explained as the time of performing the reverse rotation.

Evaluation Test

Next, evaluation tests conducted in connection with the present invention will be explained below. Each of the following evaluation tests was conducted by using a wafer W, prepared by forming a negative resist film on the front surface and exposing the resist film to form holes having an opening diameter of 60 nm in each shot region 52, and processing the wafer W with the development device 1 described above. The exposure was carried out so as to form the holes in each shot region 52 like a 3×3 matrix arranged in the longitudinal and transverse directions of the wafer W.

Evaluation Test 1

As an evaluation test 1, the development process was performed in accordance with the procedure shown in FIGS. 9 to 16D according to one embodiment of the present invention. Specifically, for the spin drying of the developing solution, the reverse rotation was performed and thereafter the normal rotation was performed. The revolution speed of the reverse rotation was set at 300 rpm and the time of performing the reverse rotation was set at one second. A measurement value obtained by measuring the diameter of each hole after the development process was corrected by subtracting a prescribed correction value from the measurement value. The correction value is a value for compensating for an error caused by the mask used for the exposure. The measurement values after the correction by use of the correction value are values reflecting the variations in the CD caused by the development process. In the following explanation, the measurement values after being corrected as above will be referred to as measurement values.

In regard to each shot region 52, the average was calculated for the measurement values of diameters of the holes. Then, the average of the measurement values of the shot region 52 was subtracted from the measurement value of the diameter of each hole of the shot region 52. The subtraction value (difference) will hereinafter be referred to as a corrected CD. In short, nine corrected CDs were calculated for each shot region 52. Then, 3σ (sigma) of the corrected CDs of each shot region 52 was calculated for every shot region 52 on the surface of the wafer W and then the average value of the 3σs (hereinafter referred to as an overall CDU) was calculated. Further, in regard to the shot regions 52 included in the cross-shaped area 53 explained referring to FIG. 7, 3σ of the corrected CDs was calculated for each shot region 52 and then the average of the 3σs (hereinafter referred to as a cross-shaped area CDU) was calculated. Incidentally, the unit of the value of the overall CDU or the cross-shaped area CDU is nm. Further, as a comparative test 1, a wafer W was processed similarly to the evaluation test 1 except for performing the spin drying of the developing solution by only the normal rotation without the reverse rotation, that is, performing the processing as explained referring to FIGS. 8A to 8C, and the overall CDU and the cross-shaped area CDU were calculated.

The smaller value of the overall CDU or the cross-shaped area CDU means higher uniformity of the CDs of the holes used for the calculation of the overall CDU or the cross-shaped area CDU. In the evaluation test 1, the overall CDU was 0.54 and the cross-shaped area CDU was 0.49. In the comparative test 1, the overall CDU was 0.59 and the cross-shaped area CDU was 0.65. Thus, it was confirmed from the result of the evaluation test 1 that performing the spin drying of the developing solution by switching the rotational direction of the wafer W improves the uniformity of the CDs of the holes on the entire surface of the wafer W, and significantly improves the uniformity of the CDs of the holes especially in the cross-shaped area 53. To sum up, effects of the present invention were confirmed by the evaluation test 1.

Evaluation Test 2

As an evaluation test 2, a wafer W was processed substantially in the same way as in the evaluation test 1 and the overall CDU and the cross-shaped area CDU were calculated. In this evaluation test 2, however, the time of performing the reverse rotation was set at 0.5 seconds to be shorter than the time of performing the reverse rotation in the evaluation test 1.

As the result of the evaluation test 2, the overall CDU was 0.62 and the cross-shaped area CDU was 0.58. Both of the overall CDU and the cross-shaped area CDU resulted in greater values in the evaluation test 2 in comparison with the evaluation test 1. The results of the evaluation tests 1 and 2 indicate that it is desirable to set the time of performing the reverse rotation at one second or longer.

Evaluation Test 3

As an evaluation test 3, wafers W were processed substantially in the same way as in the evaluation test 1 and the overall CDU and the cross-shaped area CDU were calculated for each wafer W. In this evaluation test 3, however, the processing was performed by changing the revolution speed of the reverse rotation from wafer W to wafer W within a range of 100 to 1500 rpm. The time of performing the reverse rotation was set at one second for every wafer W.

Figure 17:
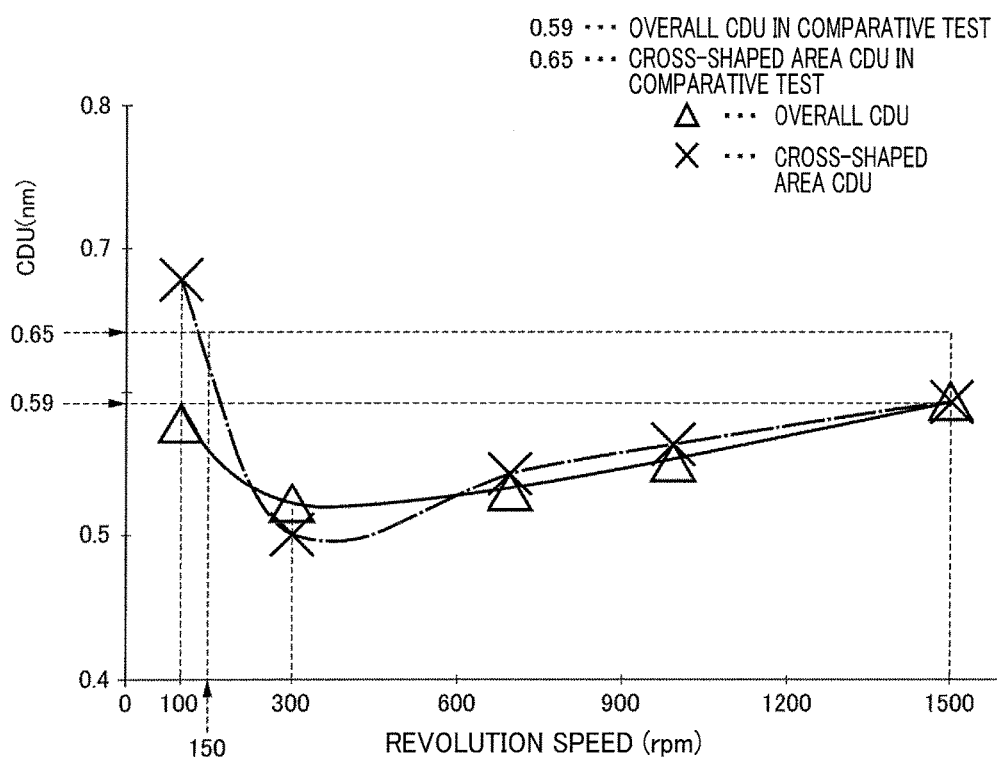
FIG. 17 is a graph showing the result of evaluation tests.

FIG. 17 is a graph showing the result of the evaluation test 3. In the graph, the horizontal axis represents the revolution speed of the wafer W (unit: rpm) and the vertical axis represents the values of the overall CDU and the cross-shaped area CDU. Triangular marks are plotted on the graph to show the overall CDUs obtained from the wafers W, while cross marks are plotted on the graph to show the cross-shaped area CDUs obtained from the wafers W. In regard to the obtained overall CDUs and cross-shaped area CDUs, regression curves calculated by means of curve fitting are drawn in the graph. The regression curve of the overall CDUs is indicated by a solid line, while the regression curve of the cross-shaped area CDUs is indicated by a chain line.

As shown in the graph, in the range of the measurement, the overall CDU and the cross-shaped area CDU hit the minimum values when the revolution speed was 300 rpm. As indicated by the regression curves, the overall CDU and the cross-shaped area CDU gradually decrease with the increase in the revolution speed towards 300 rpm, and gradually increase with the increase in the revolution speed from 300 rpm. According to the regression curves, revolution speeds in a range of 150 to 1500 rpm are desirable since the overall CDU and the cross-shaped area CDU are lower than the value 0.65 of the overall CDU and the value 0.59 of the cross-shaped area CDU obtained in the aforementioned comparative test 1. Revolution speeds in a range of 200 to 600 rpm are more desirable since the overall CDU and the cross-shaped area CDU take on especially small values.

What is claimed is:

1. A development method comprising:
    a development step of supplying a developing solution to a surface of a substrate for manufacturing a semiconductor device after undergoing formation of a resist film and exposure, to perform development;
    a first rotation step of, after the development step, increasing revolution speed of the substrate to rotate the substrate in a first rotational direction around a central axis for a time in a range of 1 to 2 seconds so as to spin off and remove part of the developing solution from the substrate; and
    a second rotation step of, after the first rotation step, rotating the substrate in a second rotational direction reverse to the first rotational direction so as to spin off and remove the developing solution remaining on the substrate from the substrate.

2. The development method according to claim 1, wherein the development step includes a step of stopping the substrate after being supplied with the developing solution.

3. The development method according to claim 2, wherein the revolution speed of the substrate in the second rotation step is higher than the revolution speed of the substrate in the first rotation step.

4. The development method according to claim 3, wherein the revolution speed of the substrate in the first rotation step is in a range of 150 to 1500 rpm.

5. The development method according to claim 2, wherein the revolution speed of the substrate in the first rotation step is in a range of 150 to 1500 rpm.

6. The development method according to claim 1, wherein the revolution speed of the substrate in the second rotation step is higher than the revolution speed of the substrate in the first rotation step.

7. The development method according to claim 6, wherein the revolution speed of the substrate in the first rotation step is in a range of 150 to 1500 rpm.

8. The development method according to claim 1, wherein the revolution speed of the substrate in the first rotation step is in a range of 150 to 1500 rpm.

9. A non-transitory computer-readable storage medium storing a computer program to be used by a development device that performs development on a substrate for manufacturing a semiconductor device after undergoing formation of a resist film and exposure,
    wherein the computer program includes steps for executing the development method according to claim 1.

* * * * *